United States Patent
Guo et al.

(10) Patent No.: US 8,367,508 B2
(45) Date of Patent: Feb. 5, 2013

(54) SELF-ALIGNED CONTACTS FOR FIELD EFFECT TRANSISTOR DEVICES

(75) Inventors: Dechao Guo, Wappingers Falls, NY (US); Wilfried E. Haensch, Somers, NY (US); Xinhui Wang, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/757,201

(22) Filed: Apr. 9, 2010

(65) Prior Publication Data

US 2011/0248321 A1 Oct. 13, 2011

(51) Int. Cl.
*H01L 21/336* (2006.01)

(52) U.S. Cl. ........ 438/300; 438/149; 438/581; 438/583; 438/587; 438/588; 257/E21.294; 257/59; 257/223

(58) Field of Classification Search .................. 438/149, 438/300, 581, 583, 587, 588, 592; 257/59, 257/223, E21.294

See application file for complete search history.

(56) References Cited

U.S. PATENT DOCUMENTS

| | | | |
|---|---|---|---|
| 5,895,961 A | 4/1999 | Chen | |
| 6,207,543 B1 | 3/2001 | Harvey et al. | |
| 6,403,485 B1 | 6/2002 | Quek | |
| 6,503,833 B1 | 1/2003 | Ajmera | |
| 6,518,151 B1 | 2/2003 | Dobuzinsky | |
| 6,800,530 B2 | 10/2004 | Lee et al. | |
| 6,987,050 B2 | 1/2006 | Cabral | |
| 7,582,567 B1 | 9/2009 | Syau | |
| 7,615,831 B2 | 11/2009 | Zhu | |
| 2006/0138552 A1 | 6/2006 | Brask et al. | |
| 2009/0134470 A1 | 5/2009 | Yang | |
| 2009/0203184 A1 | 8/2009 | Magnee | |
| 2009/0218640 A1 | 9/2009 | Hampp | |
| 2010/0038715 A1 | 2/2010 | Babich et al. | |
| 2011/0272823 A1* | 11/2011 | Sanders et al. | ................ 257/774 |

OTHER PUBLICATIONS

International Search Report, International Application No. PCT/US11/28464, International Filing Date: Mar. 15, 2011, Date of Mailing: Jul. 26, 2011.
International Search Report—Written Opinion; International Application No. PCT/US11/28464; International Filing Date: Mar. 15, 2011; Date of Mailing: Jul. 26, 2011.
Risch, L., "Pushing CMOS beyond the roadmap", Proceedings of ESSDERC, Grenoble France, (c) 2005 IEEE, downloaded on Nov. 23, 2009, pp. 63-68.
Wong, H.-S.P., "Beyond the conventional transistor", IBM J. Res. & Dev. vol. 46, No. 2/3, Mar./May 2002, (c) 2002 IBM, pp. 133-168.

* cited by examiner

*Primary Examiner* — Long Tran
(74) *Attorney, Agent, or Firm* — Cantor Colburn LLP; Vazken Alexanian

(57) ABSTRACT

A method for forming a field effect transistor includes forming a gate stack, a spacer adjacent to opposing sides of the gate stack, a silicide source region and a silicide drain region on opposing sides of the spacer, epitaxially growing silicon on the source region and the drain region; forming a liner layer on the gate stack and the spacer, removing a portion of the liner layer to expose a portion of the hardmask layer, removing the exposed portions of the hardmask layer to expose a silicon layer of the gate stack, removing exposed silicon to expose a portion of a metal layer of the gate stack, the source region, and the drain region; and depositing a conductive material on the metal layer of the gate stack, the silicide source region, and the silicide drain region.

13 Claims, 5 Drawing Sheets

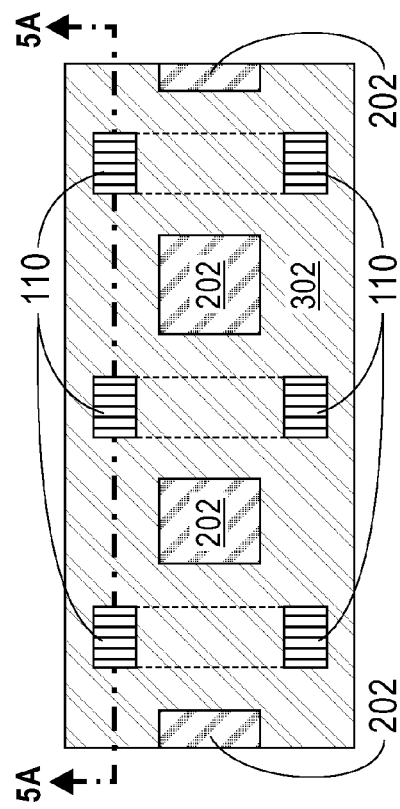
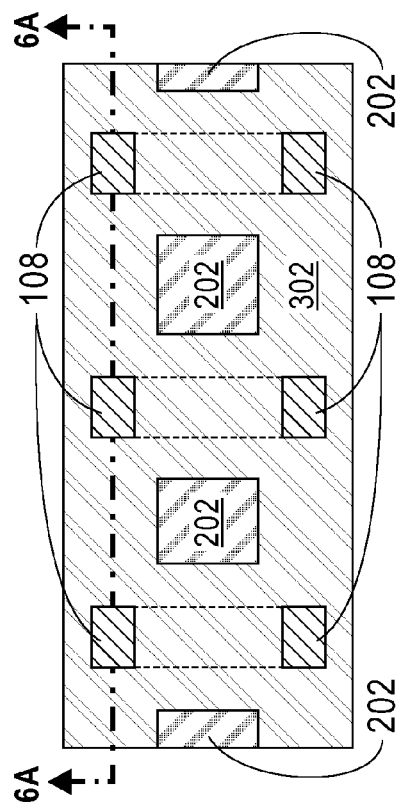
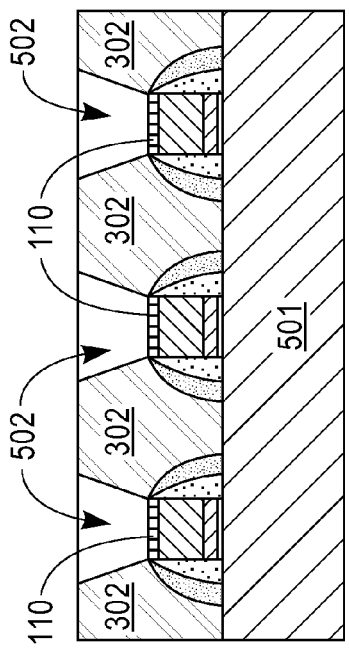
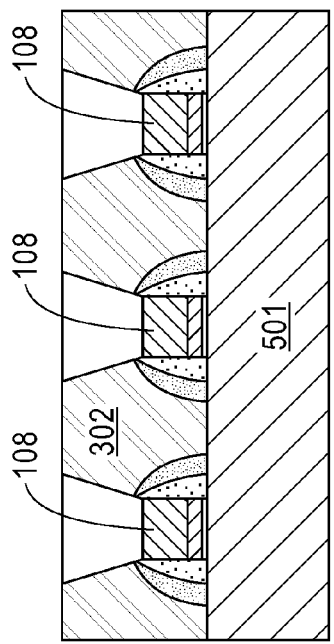
FIG. 5B
FIG. 6B
FIG. 5A
FIG. 6A

US 8,367,508 B2

SELF-ALIGNED CONTACTS FOR FIELD EFFECT TRANSISTOR DEVICES

FIELD OF INVENTION

The present invention relates to semiconductor field effect transistors.

DESCRIPTION OF RELATED ART

Semiconductor field effect transistors (FETs) include source, drain, and gate regions that are often electrically connected to metallic contacts. The fabrication of the metallic contacts may cause a short between the contacts, if the metallic contacts are misaligned in the fabrication process.

BRIEF SUMMARY

In one aspect of the present invention, method for forming a field effect transistor includes forming a gate stack on a substrate, forming a spacer on the substrate adjacent to opposing sides of the gate stack, forming a silicide source region on the substrate adjacent to the spacer on a first side of the gate stack, forming a silicide drain region on the substrate adjacent to the spacer on a second side of the gate stack, epitaxially growing silicon on the exposed silicide source region and the exposed silicide drain region, forming a liner layer on a hardmask layer of the gate stack and the spacer, removing a portion of the liner layer to expose a portion of the hardmask layer, removing the exposed portions of the hardmask layer to expose a silicon layer of the gate stack, removing exposed silicon to expose a portion of a metal layer of the gate stack, the silicide source region, and the silicide drain region, and depositing a conductive material on the exposed metal layer of the gate stack, the exposed silicide source region, and the exposed silicide drain region.

In another aspect of the present invention, a field effect transistor device includes a gate stack disposed on a substrate a first contact portion disposed on a first distal end of the gate stack, a second contact portion disposed on a second distal end of the gate stack, the first contact portion disposed a distance (d) from the second contact portion, and a third contact portion having a width (w) disposed in a source region of the device, the distance (d) is greater than the width (w).

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8C illustrate a method and resultant structure for forming a field effect transistor device.

DETAILED DESCRIPTION

Figure 1A:
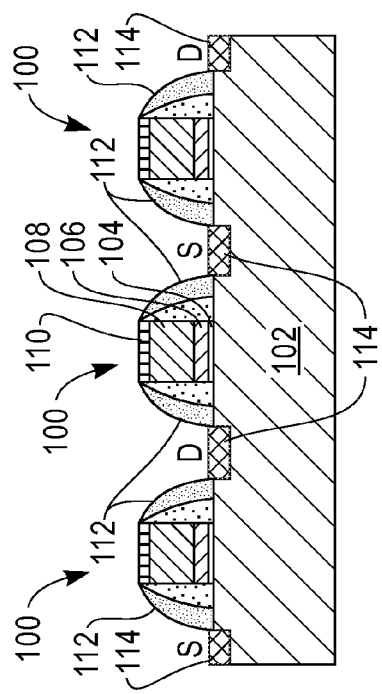
Figure 1B:
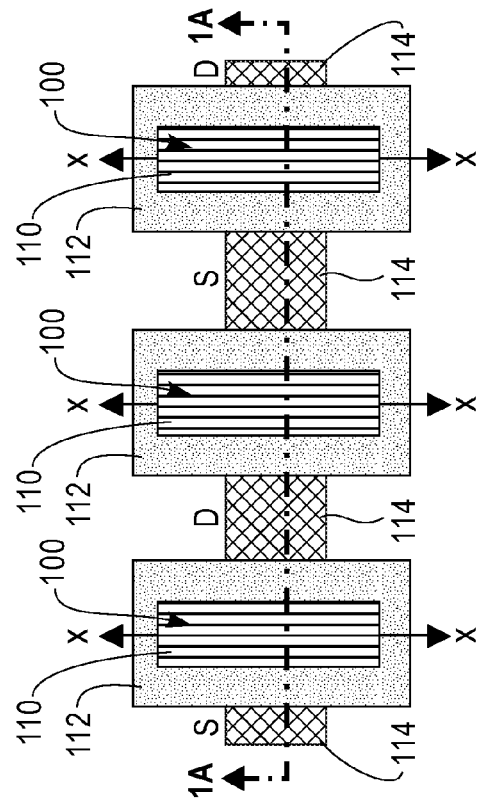

FIGS. 1A and 1B illustrate a cut-away and top-down view respectively of a method for forming a FET. FIG. 1A illustrates a plurality of gate stacks 100 disposed on a silicon substrate 102 that may include a silicon portion and a silicon-on-insulator trench portion (SOI) 501 (shown in FIG. 5A described below). The gate stacks 100 are arranged parallel having longitudinal axis x (shown in FIG. 1B). In the illustrated embodiment, the gate stack 100 includes a dielectric layer 104, such as, for example, a High-K dielectric material disposed on the substrate 102. A metal layer 106 such as, for example, TaN is disposed on the dielectric layer 104. A silicon layer 108 is disposed on the metal layer 106, and a hardmask layer 110 such as, for example, a SiN material is disposed on the silicon layer 108. A spacer 112 is formed on the substrate 102 along the sides of the gate stack 100. The spacer 112 may be formed from, for example, nitride materials, and may include any number of layers, and combinations of materials in the layers. In the illustrated embodiment, the spacer 112 includes two layers of spacer materials. Source regions (S) and drain regions (D) are formed on the substrate 102 adjacent to the spacers 112. The source and drain regions include a silicide 114 material such as, for example, $WSi_2$ or $NiSi_2$ that is formed on the source and drain regions.

Figure 2A:
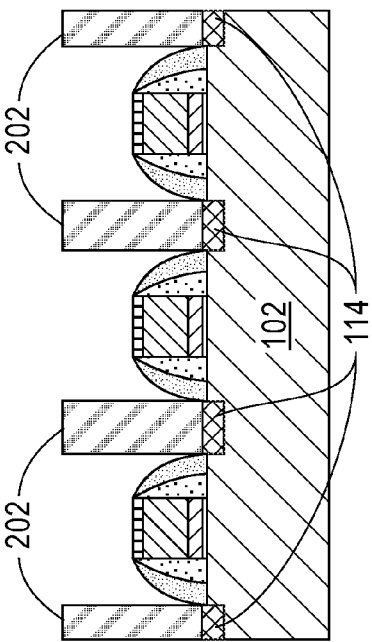
Figure 2B:
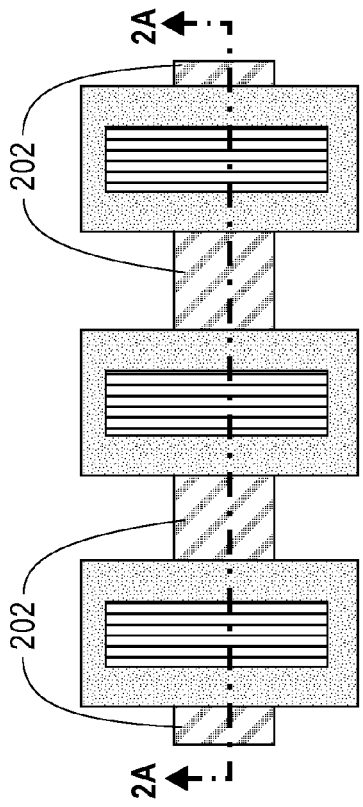

FIGS. 2A and 2B illustrate the resultant structure following the epitaxial growth of silicon on the exposed silicide 114 of the source and drain regions. The epitaxial growth results in exposed silicon regions 202 that extend from the silicide 114.

Figure 3B:
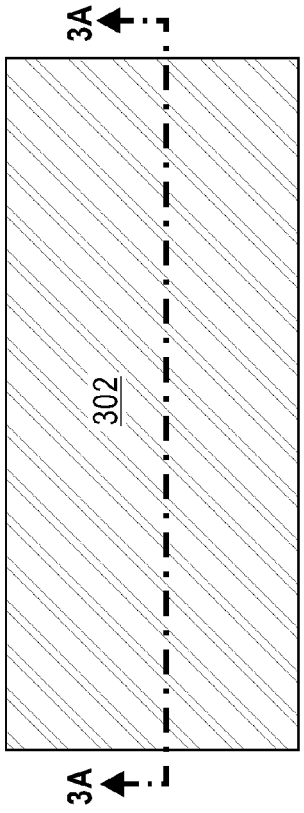
Figure 3A:
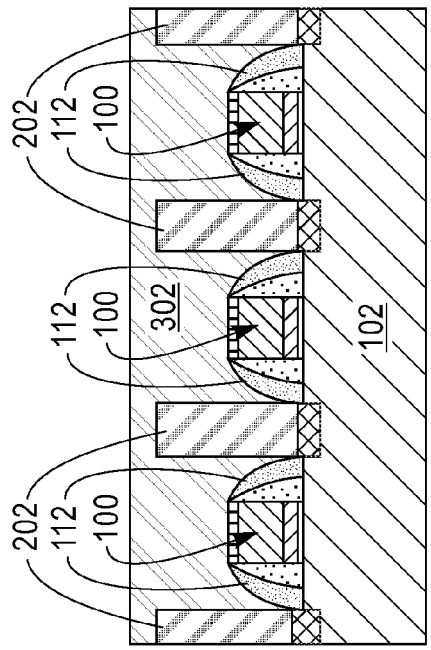

FIGS. 3A and 3B illustrate the resultant structure following the deposition of a liner layer 302 over the gate stack 100, the silicon regions 202, and the spacers 112. The liner layer 302 may include, for example, an oxide layer.

Figure 4B:
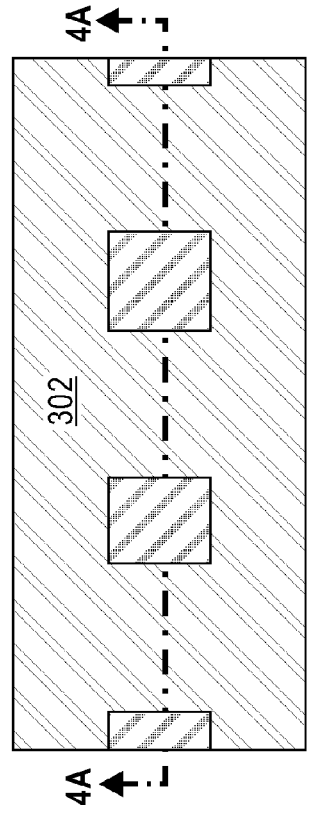
Figure 4A:
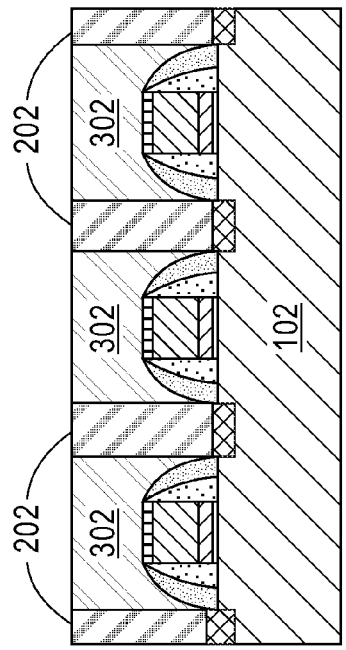

FIGS. 4A and 4B illustrate the resultant structure following the removal of a portion of the liner layer 302 to expose portions of the silicon regions 202. The portion of the liner layer 302 may be removed by, for example, a chemical mechanical polishing (CMP) process, or other suitable mechanical or chemical process.

FIGS. 5A and 5B illustrate the resultant structure following the removal of portions of the liner layer 302 to expose portions of the hardmask layer 110. The removal of portions of the liner layer 302 form cavities 502 defined by the hardmask layer 110 and the liner layer 302.

FIGS. 6A and 6B illustrate the resultant structure following the removal of the exposed portions of the hardmask layer 110, which exposes portions of the silicon layer 108. The exposed portions of the hardmask layer 110 may be removed by an etching process such as, for example, reactive ion etching (RIE) or another suitable etching process that is selective to etch the hardmask layer 110 material.

Figure 7B:
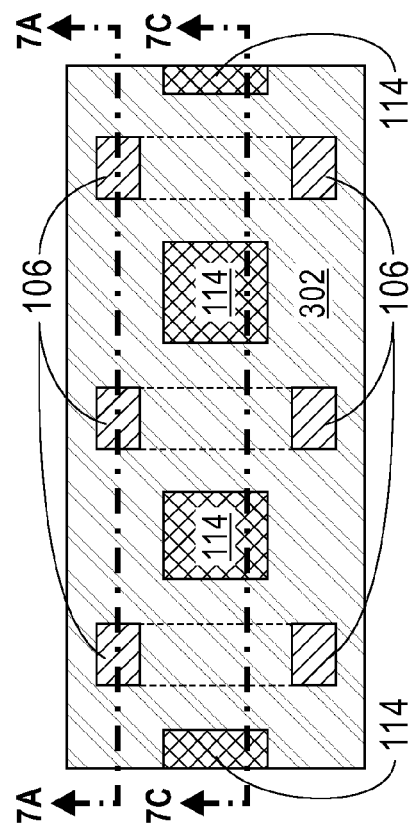
Figure 7A:
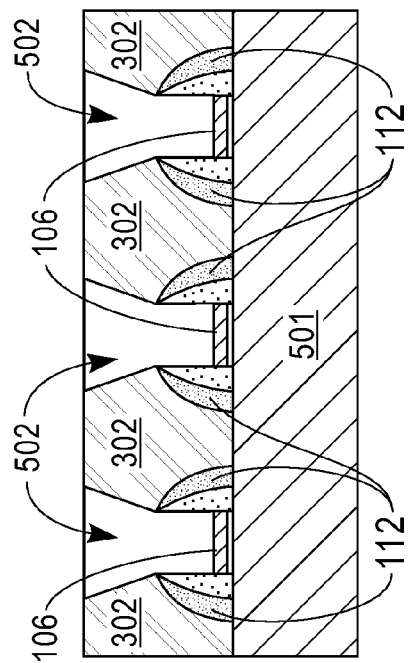
Figure 7C:
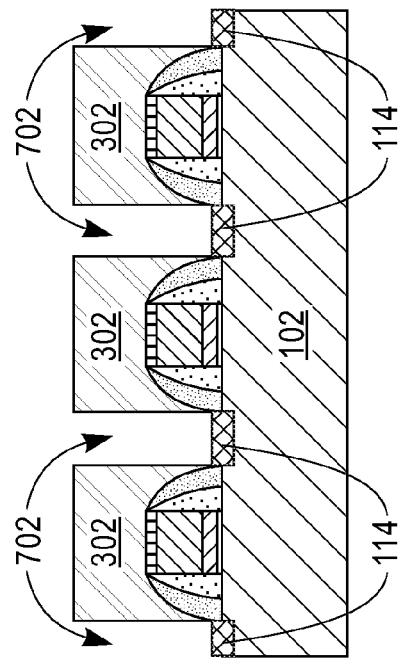

FIGS. 7A, 7B, and 7C illustrate the resultant structure following the removal of the exposed portions of the silicon layer 108 (of FIG. 6A), and the silicon regions 202 (of FIG. 6B). The exposed silicon may be removed by, for example, a RIE process that removes silicon or any other suitable etching process. The removal of the exposed portions of the silicon layer 108 exposes portions of the metal layer 106 the and increases the depth of the cavities 502 such that the cavities 502 are defined by the liner layer 302, the spacers 112, and the metal layer 106, while the removal of the silicon regions 202 exposes the silicide 114 source and drain regions and forms cavities 702 in the liner layer 302. The cavities 702 are defined by the liner layer 302 and the silicide 114.

Figure 8B:
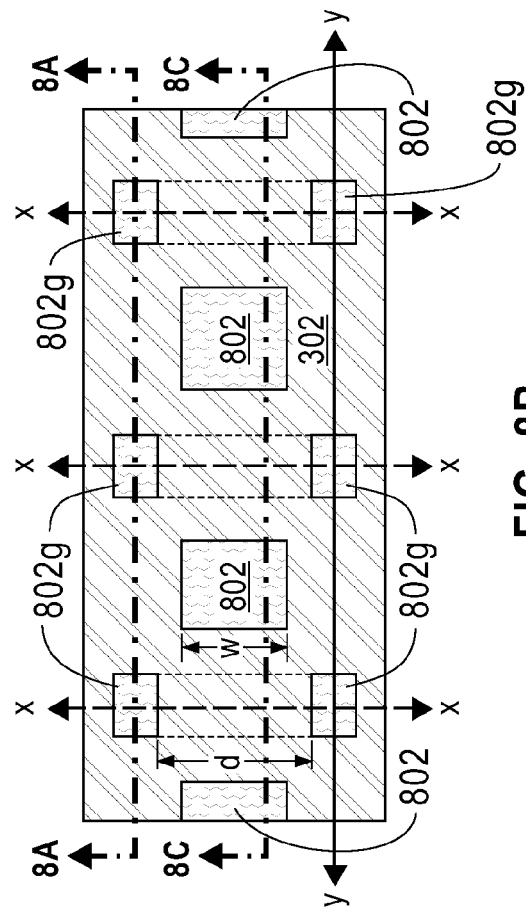
Figure 8A:
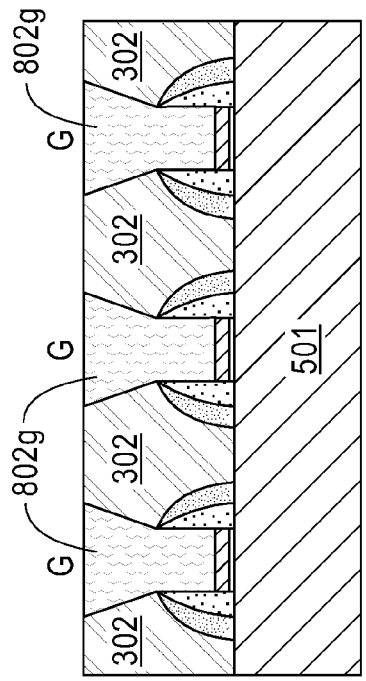
Figure 8C:
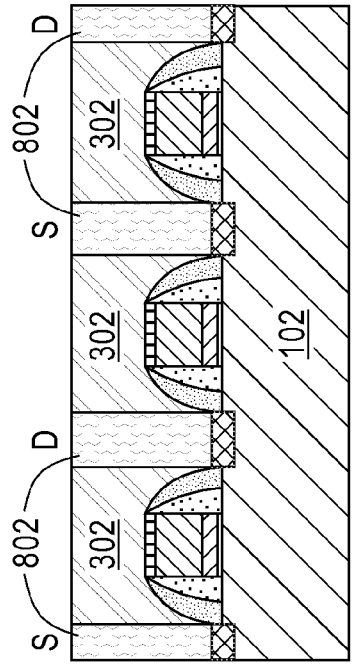

FIGS. 8A, 8B, and 8C illustrate the resultant structure following the formation of conductive contacts 802 and 802g in the cavities 502 and 707 (of FIGS. 7A and 7C). The conductive contacts 802 and 802g may be formed by depositing a layer of metal material such as, for example, silver, gold, or aluminum in the cavities 502 and 702, and over the exposed liner layer 302. A polishing process such as, for example CMP or another suitable process may be used to remove the metal material from the liner layer 302, and in some embodiments, a portion of the liner layer 302 to define the contacts 802 and 802g. The contacts 802 and 802g are electrically connected to the source, drain and gate (G) regions of the devices.

Referring to FIG. 8B, the source and drain region contacts 802 are arranged along the transverse axis shown by line 8C that is orthogonal to the longitudinal axis x of the gate stacks 100 (of FIG. 1B) the line 8C intersects the medial of the gate stacks 100. The gate region contacts 802g are arranged along the parallel axis shown by lines 8C and y that are orthogonal to the longitudinal axis of the gate stacks 100 and parallel to the longitudinal axis x. The gate region contacts 802g are spaced a distance (d) on distal ends of the gate stacks 100. The source and drain region contacts 802 have a width (w). In the illustrated embodiment, the distance d is greater than the width w. The offset of the gate region contacts 802g from the source and drain region contacts 802 reduces the occurrence of shorts between the contacts 802 and 802g in fabrication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect transistor, the method comprising:
    forming a gate stack on a substrate;
    forming a spacer on the substrate adjacent to opposing sides of the gate stack;
    forming a silicide source region on the substrate adjacent to the spacer on a first side of the gate stack;
    forming a silicide drain region on the substrate adjacent to the spacer on a second side of the gate stack;
    epitaxially growing silicon on the exposed silicide source region and the exposed silicide drain region;
    forming a liner layer on a hardmask layer of the gate stack and the spacer;
    removing a portion of the liner layer to expose a portion of the hardmask layer;
    removing the exposed portions of the hardmask layer to expose a silicon layer of the gate stack;
    removing exposed silicon to expose a portion of a metal layer of the gate stack, the silicide source region, and the silicide drain region; and
    depositing a conductive material on the exposed metal layer of the gate stack, the exposed silicide source region, and the exposed silicide drain region.

2. The method of claim 1, wherein the silicide source region and the silicide drain region are aligned on a first axis, the first axis aligned orthogonally to the gate stack.

3. The method of claim 2, wherein the exposed a portion of the hardmask layer of the gate stack is aligned on a second axis, the second axis aligned in parallel to the first axis.

4. The method of claim 1, wherein the gate stack includes a dielectric layer disposed on the substrate, the metal layer disposed on the dielectric layer, the silicon layer disposed on the dielectric layer, and the hardmask layer disposed on the silicon layer.

5. The method of claim 1, wherein the spacer includes a nitride material.

6. The method of claim 1, wherein the spacer includes a first nitride layer and a second nitride layer.

7. The method of claim 1, wherein the removal of the portion of the liner layer to expose a portion of the hardmask layer forms a cavity defined by the liner layer and the exposed portion of the hardmask layer.

8. The method of claim 1, wherein the removal of the exposed silicon forms a cavity defined by the liner layer and the silicide drain region.

9. The method of claim 1, wherein the substrate includes a silicon region and a silicon-on-insulator trench region (SOI).

10. The method of claim 1, wherein the liner layer is formed on the epitaxially grown silicon, and the method further includes removing a portion of the liner layer and the epitaxially grown silicon prior to removing a portion of the liner layer to expose a portion of the hardmask layer.

11. The method of claim 10, wherein the portion of the liner layer and the epitaxially grown silicon are removed with a chemical mechanical polishing process.

12. The method of claim 1, wherein the exposed silicon is removed with a reactive ion etching process.

13. The method of claim 1, wherein the exposed portions of the hardmask layer are removed with a reactive ion etching process.

* * * * *